(12) United States Patent
Delorme et al.

(10) Patent No.: US 7,728,603 B2
(45) Date of Patent: Jun. 1, 2010

(54) TEST METHOD FOR A VARIABLE CAPACITANCE MEASURING SYSTEM

(75) Inventors: Nicolas Delorme, Grenoble (FR); Cyril Condemine, Grenoble (FR); Marc Belleville, Saint Egreve (FR)

(73) Assignee: Commissariat A l'Energie Atomique, Paris (FR)

( * ) Notice: Subject to any disclaimer, the term of this patent is extended or adjusted under 35 U.S.C. 154(b) by 680 days.

(21) Appl. No.: 11/630,989

(22) PCT Filed: Jul. 7, 2005

(86) PCT No.: PCT/FR2005/050548

§ 371 (c)(1),
(2), (4) Date: Dec. 28, 2006

(87) PCT Pub. No.: WO2006/008417

PCT Pub. Date: Jan. 26, 2006

(65) Prior Publication Data

US 2009/0167320 A1    Jul. 2, 2009

(30) Foreign Application Priority Data

Jul. 9, 2004   (FR)   .................................. 04 51489

(51) Int. Cl.
*G01R 31/02* (2006.01)
*G01R 27/26* (2006.01)
*G06F 17/50* (2006.01)
*G01P 15/125* (2006.01)

(52) U.S. Cl. .......................... 324/537; 324/686; 703/14; 73/514.32

(58) Field of Classification Search ................. 324/537; 73/514.32
See application file for complete search history.

(56) References Cited

U.S. PATENT DOCUMENTS 3,771,050 A * 11/1973 Golahny et al. ............. 324/654
5,103,667 A    4/1992 Allen et al.
5,315,232 A *  5/1994 Stewart ....................... 324/72
5,351,519 A   10/1994 Kress

FOREIGN PATENT DOCUMENTS

GB          2 239 096          6/1991

* cited by examiner

*Primary Examiner*—Timothy J Dole
(74) *Attorney, Agent, or Firm*—Oblon, Spivak, McClelland, Maier & Neustadt, L.L.P.

(57) ABSTRACT

A method for testing a variable capacitance measurement system including a fixed voltage source, a variable capacitance sensor, and a circuit to process information output by this sensor. The method connects an electrically controllable electronic simulation device to replace the variable capacitance sensor, models the electrophysical behaviour of the sensor, and tests the system.

9 Claims, 4 Drawing Sheets

TEST METHOD FOR A VARIABLE CAPACITANCE MEASURING SYSTEM

TECHNICAL DOMAIN

This invention relates to a method of testing a variable capacitance measurement system.

The domain of the invention is microsystems comprising a capacitive sensor and a circuit to process information output by this sensor.

STATE OF PRIOR ART

Such microsystems with capacitive sensor are only partially tested in known art because their operation cannot be simulated with a sufficiently high resolution. There is thus an omission in methods of testing them, such that:

Firstly, a purely electrical test is carried out not taking account of the sensor to check operation, and then the assembly, in other words the sensor part combined with the circuit processing information output by the sensor, is tested.

The disadvantage of such a method is that the test of the assembly is distorted by errors caused by lack of precise knowledge firstly of the electromechanical characteristics of the sensor and secondly of the signal to be measured.

The purpose of the invention is a test method overcoming this omission.

PRESENTATION OF THE INVENTION

The invention relates to a method for testing a variable capacitance measurement system comprising a voltage source, a variable capacitance sensor and a circuit to process information output by this sensor, characterised in that it comprises:

a step to connect an electrically controllable electronic emulation device to replace the variable capacitance sensor, and thus present a measurable magnitude to the processing circuit, a step to model the electrophysical behaviour of this sensor, a step to test the system.

Advantageously, the method according to the invention includes the following during the connection step:

a step in which a fixed capacitor is connected between the voltage source and the processing circuit, and a step in which a variable voltage source is connected as the voltage source to emulate a variation in the capacitance of said sensor, by means of variations of the voltage applied to this capacitor.

Advantageously, the value of the fixed capacitor is approximately equal to the capacitance of the sensor at rest.

The method according to the invention overcomes uncertainties related to the sensor (precise electromechanical characteristics or even just availability) and to the phenomenon to be measured (amplitude and frequency), and calibration of the machine that generates this phenomenon during the functional verification phase of the microsystem setting, or even purely electrical sorting of components after manufacture.

For example, the method according to the invention is applicable to the case of a capacitive accelerometer with a resolution better than 16 bits (~$1.5 \times 10^{-3}$%) whereas the resolution of test devices according to prior art, for example vibrating bridges, does not exceed 12 bits ($2.5 \times 10^{-2}$%). The verification of the performances of a 16-bit accelerometer, for which the full scale capacitance variation is 1 pF, creates capacitance variations with a resolution of the order of 15 atofarad ($15 \times 10^{-18}$ Farad), whereas a vibrating bridge with a precision of 12 bits only provides a resolution of the order of 250 atoFarad.

DETAILED PRESENTATION OF PARTICULAR EMBODIMENTS

The method according to the invention is a test method for a variable capacitance measurement microsystem. Conventionally, such a microsystem comprises a fixed voltage source, a variable capacitance sensor and a circuit for processing information output by this sensor.

Figure 1:
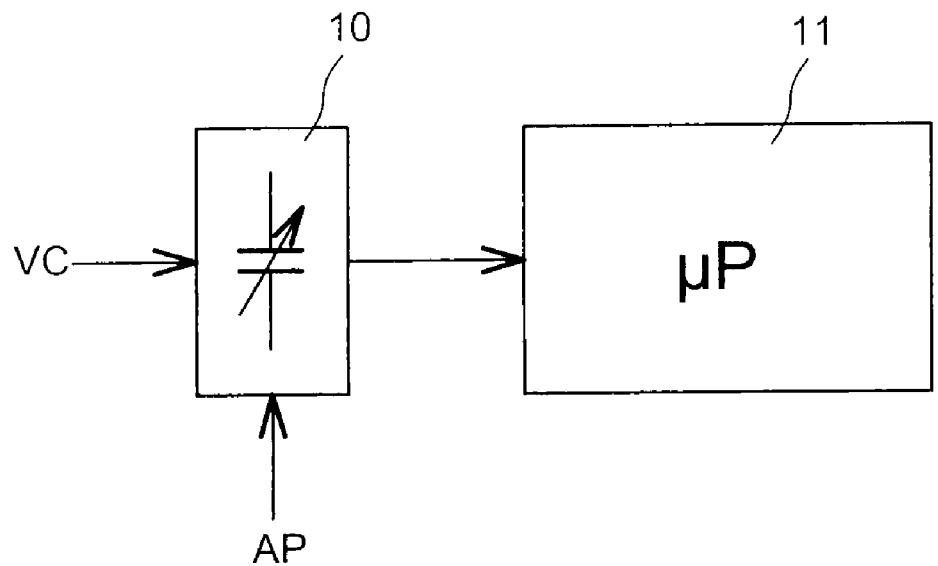
FIG. 1 illustrates the block diagram for a capacitive measurement system in normal mode.

FIG. 1 thus illustrates an acceleration measurement microsystem comprising a capacitive sensor 10 and a processing circuit 11 used to measure the values of the capacitance of the sensor in a normal operating mode, VC being a constant excitation current and AP a physical acceleration.

In the method according to the invention, a fixed capacitor is connected between the voltage source and the processing circuit, this voltage source being a variable voltage source.

Figure 2:
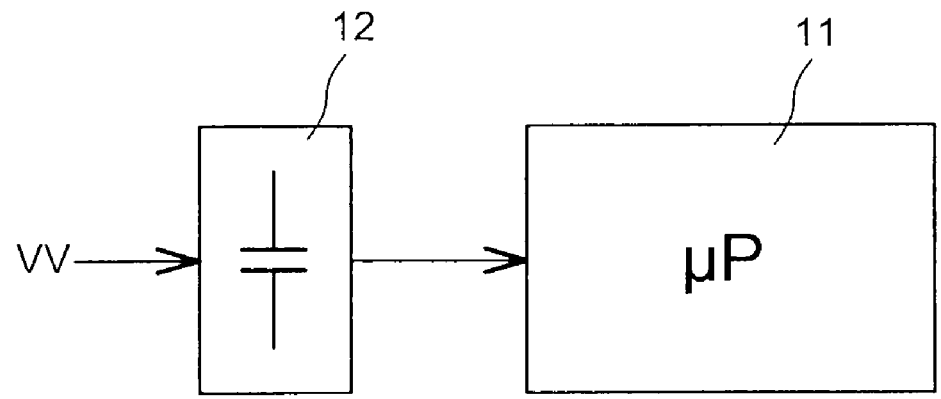
FIG. 2 illustrates the block diagram for such a measurement microsystem in test mode, using the method according to the invention.

FIG. 2 thus illustrates the transformation of the microsystem illustrated in FIG. 1 in test mode. The capacitive sensor 10 is replaced by a fixed capacitor 12 integrated into the circuit or external to it. The constant excitation voltage VC and the physical acceleration AP are replaced by a variable excitation voltage VV. This excitation voltage VV is calculated so that the charge presented to the processing circuit 11 in test mode is identical to the charge in normal mode for a given constant excitation voltage VC and physical acceleration AP.

The method according to the invention can simulate a sensor that cannot be used either because it is unavailable, or because it cannot be operated to its limits.

Although it is easy to simulate variations in the voltage or current, it is difficult to simulate variations in the capacitance, particularly because the processing circuit must not be modified because it has to be tested in its initial state. Thus, the capacitive sensor 10 is replaced by a fixed capacitor 12 with a value approximately equal to the value of the capacitive sensor at rest so as to maintain a capacitive behaviour, variations in the capacitance then being emulated by means of voltage variations applied to this capacitor, to assure that the device according to the invention has a genuinely capacitive behaviour.

As a result of these characteristics, the resolution is transferred from the capacitances domain to the voltages domain, in which there is no problem in achieving very high precision levels.

More generally, the purpose of the invention is to delay variations in a physical parameter of a sensitive element (capacitor, resistance, inductance) on voltage or current variations that are simpler to obtain and that can be more precise.

In the example illustrated in FIG. 2, the processing circuit 11 can be used to measure capacitance values of the sensor through a measurement of the charge at constant charging voltage. The variation in the capacitance related to the variation in acceleration then varies the charge. The sensor can be replaced by an emulation device, in this case composed of a constant capacitance, the charge voltage varying so as to produce a variation of the charge Q (Q=CV) corresponding to the original acceleration variation. The emulation device can then produce the same effect as seen from the processing circuit 11 as the real sensor to which a given acceleration is applied, by an appropriate voltage control.

Figure 3:
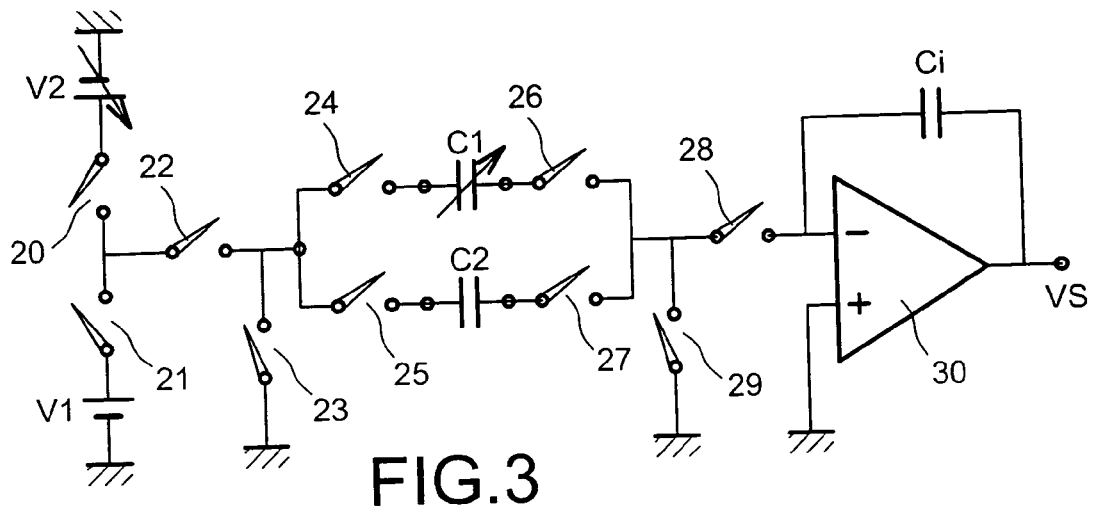
FIGS. 3 to 5 illustrate an example embodiment of the test method according to the invention.

FIG. 3 illustrates one example embodiment of the method according to the invention. The two operating modes (normal mode and test mode) are selected using switches 20, 21, 24-27. V1 is a constant voltage and V2 is a variable voltage. An operational amplifier 30 is arranged at the output, a capacitor C1 being connected between its negative input and its output. Normal mode is activated when the test signal that controls switches 21, 24 and 26 is valid and test mode is activated when the test signal that controls switches 20, 25 and 27 is valid. C1 is the capacitive sensor 10 in FIG. 1. C2 is the constant capacitance 12 in FIG. 2. The output from the operational amplifier will be the image (by integration on Ci) of the charge stored by C1 or C2 as a function of the state of switches 20, 21, 24-27.

Figure 4:
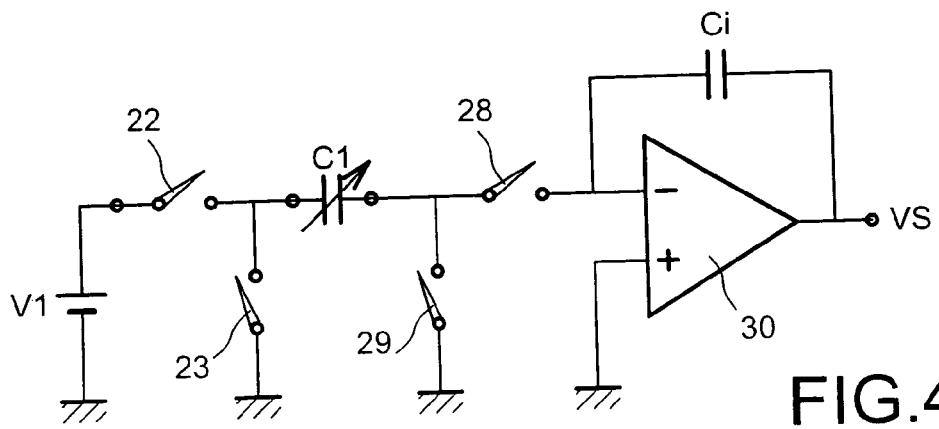

Operation of the processing circuit in normal mode, in other words not in test mode, is illustrated in FIG. 4. The capacitance C1 of the sensor is variable and it is evaluated by integrating the charge contained in it when a constant voltage V1 is applied to it. Consider two successive non-overlapping clock phases Phi1 and phi2. When the switches 22 and 29 validated by phase phi1 close, capacitor C1 is charged at constant voltage V1. Later, when switches 23 and 28 validated by phase phi2 close, the charge contained on C1 is transferred to the integration capacitor Ci, producing a variation of the output voltage VS equal to ΔVout=C1/Ci·Vc.

Figure 5:
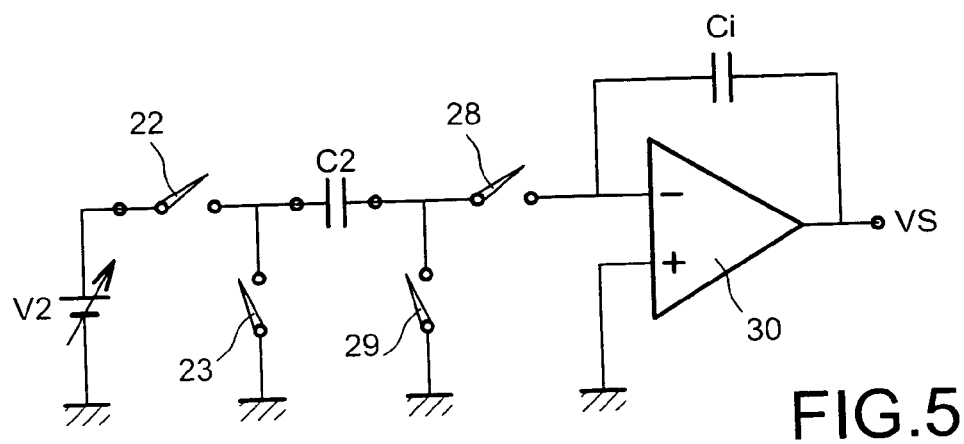

During operation in test mode illustrated in FIG. 5, the value of capacitor C2 is chosen equal to the value of capacitor C1 at rest (at zero acceleration) so as to optimise reproduction of the behaviour of the circuit in normal mode. V2 is then chosen as follows to emulate a variation in the sensor capacitance $\Delta C1_{max}$ (and especially the corresponding charge):

$$V2_{DC}=V1_{DC} \text{ and}$$

$$C2 \cdot \Delta V2_{max} = \Delta C1_{max} \cdot V1$$

Figure 6:
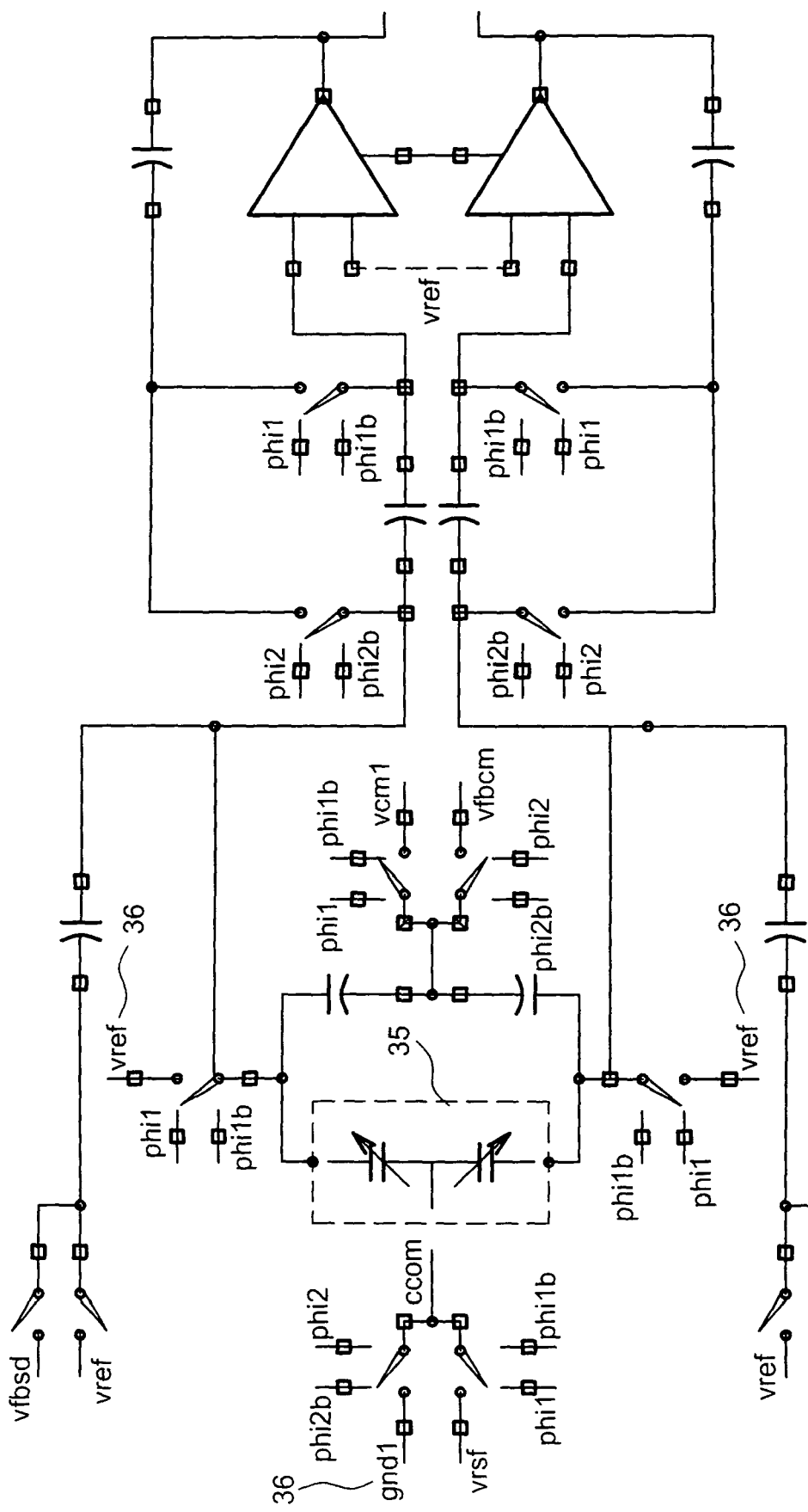
FIG. 6 illustrates another example embodiment of the test method according to the invention in normal mode.

In one example embodiment illustrated in FIG. 6, the capacitive sensor comprises two capacitors (module 35), each having its own control circuit and test circuit. These two capacitors vary in opposite directions depending on the acceleration. The processing circuit evaluates the difference in capacitances of the sensor by measuring the charge at constant charging voltage. The variation in the capacitance related to the variation in the acceleration then causes a variation in the charge. The voltages 36 are fixed measurement voltages. All <<phi>> values are commands applied to the switches at different moments.

Figure 7:
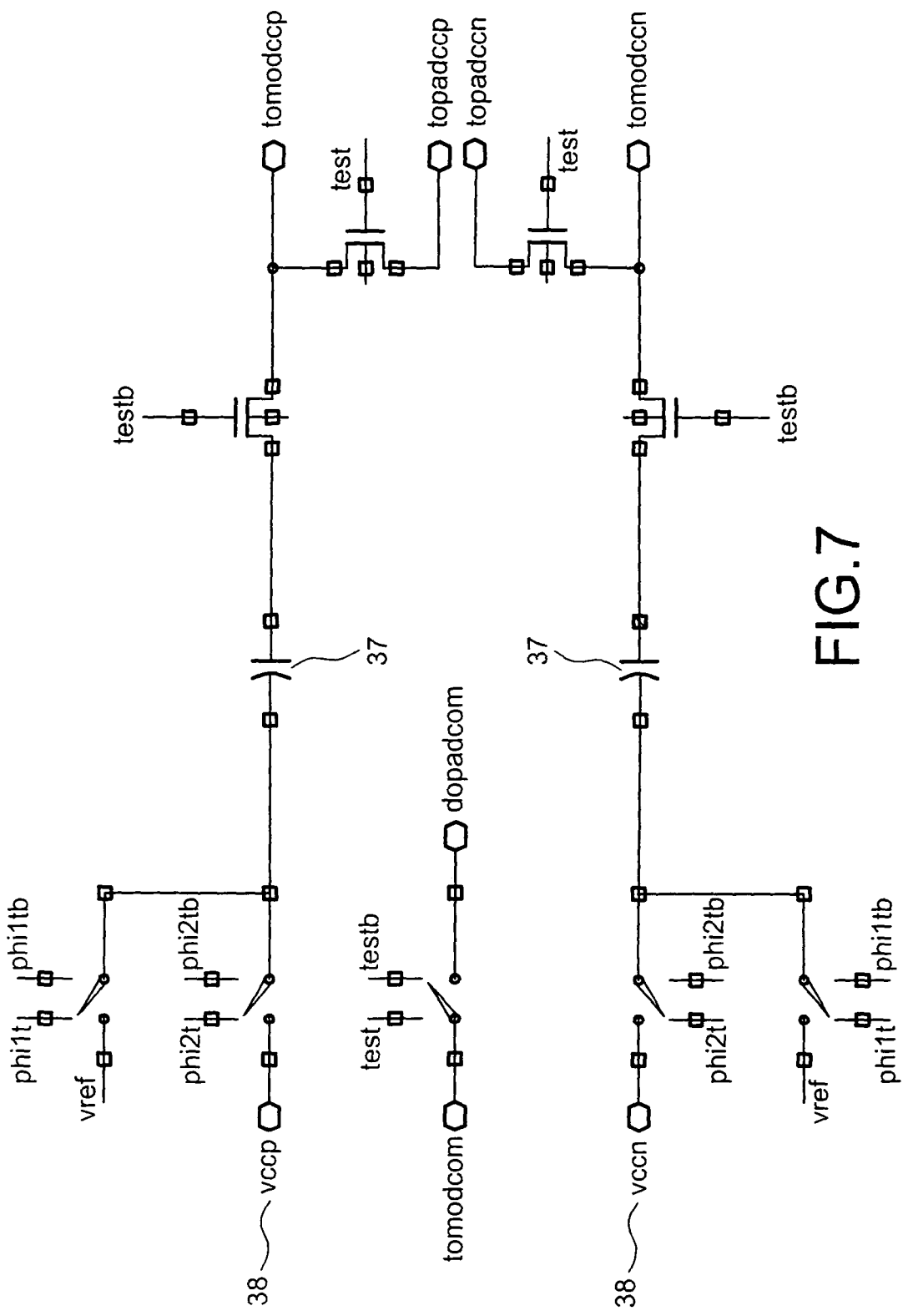
FIG. 7 illustrates an example embodiment of a capacitive sensor emulation device, the processing circuit not being shown.

FIG. 7 illustrates an example embodiment of an electrical emulation device of this capacitive sensor, that replaces module reference 35 in FIG. 6. The integrated capacitors 37 are fixed and the charge voltages 38 are variable. The <<test>> and <<testb>> signals control either the connection of the sensor to the processing circuit (connection of signals <<topadccp>> to <<tomodccp>>, <<topadccn>> to <<tomodccn>>, <<topadcom>> to <<tomodcom>>) and disconnection of the electrical emulation device from this same circuit, or the inverse, namely disconnection of the sensor and connection of the electrical emulation device.

The invention claimed is:

1. A method for testing a variable capacitance measurement system, the system including a voltage source, a variable capacitance sensor, and a processing circuit to process information output by the variable capacitance sensor, the method comprising:
    replacing the variable capacitance sensor of the measurement system with an electronically controllable simulation device having a fixed capacitor;
    modeling the electro-physical behavior of the variable capacitance sensor to generate a voltage signal, the voltage signal able to cause similar electro-physical values generated by a variation of a capacitance of the variable capacitance sensor when applied to the fixed capacitor; and
    testing the measurement system with the voltage signal to obtain characteristics of the variable capacitance measurement system.

2. The method for testing according to claim 1, wherein said step of modeling the electro-physical behavior, the generated voltage signal is able to cause a variation of a charge in the fixed capacitor that is similar to a variation of the charge of the variable capacitance sensor.

3. The method for testing according to claim 1, wherein said variable capacitance measurement system is a capacitive-type accelerometer.

4. The method for testing according to claim 3, wherein the generated voltage signal is a time-variable voltage that can cause a variation of a charge in the fixed capacitor that is similar to a variation of the charge caused by an acceleration of the variable capacitance measurement system.

5. The method for testing according to claim 4, wherein said step of testing a full scale of capacitance variation of the variable capacitance sensor is simulated.

6. The method for testing according to claim 1, wherein a capacitance of the fixed capacitor is approximately equal to a capacitance of the variable capacitance sensor at rest.

7. A method for testing a variable capacitance measurement system, the system including a voltage source, a variable capacitance sensor, and a processing circuit to process information output by the variable capacitance sensor, the variable capacitance sensor of the measurement system having been replaced by a fixed capacitor, the method comprising:
    modeling the electro-physical behavior of the variable capacitance sensor to generate a voltage signal, the voltage signal able to cause similar electro-physical values generated by a variation of a capacitance of the variable capacitance sensor, when applied to the fixed capacitor; and
    testing the measurement system with the voltage signal to obtain characteristics of the variable capacitance measurement system.

8. The method for testing according to claim 7, wherein said variable capacitance measurement system is a capacitive-type accelerometer.

9. The method for testing according to claim 8, wherein the generated voltage signal is a time-variable voltage that can cause a variation of a charge in the fixed capacitor that is similar to a variation of the charge caused by an acceleration of the variable capacitance measurement system.

* * * * *